(12) United States Patent
Park et al.

(10) Patent No.: US 9,395,419 B2
(45) Date of Patent: Jul. 19, 2016

(54) METHOD AND DEVICE FOR PREDICTING STATE-OF-HEALTH OF BATTERY, AND BATTERY MANAGEMENT SYSTEM USING SAME

(71) Applicant: LG CHEM, LTD., Seoul (KR)

(72) Inventors: Kyuha Park, Seoul (KR); Cheol Taek Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 170 days.

(21) Appl. No.: 14/012,298

(22) Filed: Aug. 28, 2013

(65) Prior Publication Data
US 2013/0346001 A1 Dec. 26, 2013

Related U.S. Application Data

(63) Continuation of application No. PCT/KR2013/000810, filed on Jan. 31, 2013.

(30) Foreign Application Priority Data

Feb. 2, 2012 (KR) .................. 10-2012-0010661

(51) Int. Cl.
*G01R 31/36* (2006.01)

(52) U.S. Cl.
CPC ........ *G01R 31/3679* (2013.01); *G01R 31/3606* (2013.01); *G01R 31/3651* (2013.01)

(58) Field of Classification Search
CPC ........... G01R 31/3679; G01R 31/3651; G01R 31/3624; G01R 31/3606; G01R 31/3662; G01R 31/36; G01R 27/14; H01M 10/48
See application file for complete search history.

(56) References Cited

U.S. PATENT DOCUMENTS

| | | | |
|---|---|---|---|
| 7,615,967 B2 * | 11/2009 | Cho et al. ............... | 320/132 |
| 2005/0001627 A1 | 1/2005 | Anbuky et al. | |
| 2007/0001679 A1 | 1/2007 | Cho et al. | |
| 2007/0176592 A1 | 8/2007 | Honda et al. | |
| 2009/0132186 A1 | 5/2009 | Esnard et al. | |
| 2010/0036626 A1 | 2/2010 | Kang et al. | |
| 2011/0060538 A1 | 3/2011 | Fahimi et al. | |
| 2011/0112781 A1 | 5/2011 | Anderson et al. | |

FOREIGN PATENT DOCUMENTS

| | | |
|---|---|---|
| CN | 101221225 A | 7/2008 |
| JP | 2000-134705 A | 5/2000 |

(Continued)

OTHER PUBLICATIONS

International Search Report issued in PCT/KR2013/000810, mailed on May 15, 2013.
Written Opinion issued in PCT/KR2013/000810, mailed on May 15, 2013.
Korean Office Action for Appl. No. 10-2012-0010661 dated Aug. 29, 2014 (w/ English translation).

(Continued)

*Primary Examiner* — Toan Le
(74) *Attorney, Agent, or Firm* — Birch, Stewart, Kolasch & Birch, LLP

(57) ABSTRACT

Disclosed are a method and a device for predicting a state-of-health of a battery and a battery management system using same. The method for predicting a state-of-health of a battery includes estimating state-of-health (SOH) estimation values for predicting an aged degree of the battery for each time; aligning the plurality of estimated values to create a history table; extracting candidate values from the history table; and determining a targeted SOH of the battery based on the candidate values.

11 Claims, 3 Drawing Sheets

(56) References Cited

FOREIGN PATENT DOCUMENTS

| | | | |
|---|---|---|---|
| JP | 2004-222473 | A | 8/2004 |
| JP | 2007-205725 | A | 8/2007 |
| JP | 2008-116208 | A | 5/2008 |
| JP | 2009-121931 | A | 6/2009 |
| JP | 2009-253993 | A | 10/2009 |
| JP | 2010-37986 | A | 2/2010 |
| JP | 2011-56976 | A | 3/2011 |
| KR | 10-2004-0005117 | A | 1/2004 |
| KR | 10-2007-0003631 | A | 1/2007 |
| KR | 10-2010-0063343 | A | 6/2010 |
| KR | 10-2011-0084633 | A | 7/2011 |

OTHER PUBLICATIONS

Japan Office Action for Appl. No. 2013-556564 dated Nov. 4, 2014 (w/ English translation).
China Office Action for Appl. No. 201380000922.6 dated Jan. 7, 2015 (w/ English translation).
European Search Report dated Jun. 12, 2015 for Appl. No. 13743135.9.
Chinese Office Action, dated Aug. 28, 2015, for Chinese Application No. 201380000922.6, together with an English transition thereof.
Japanese Office Action, dated Aug. 11, 2015, for Japanese Application No. 2013-556564, together with an English translation thereof.
Chinese Office Action, dated Dec. 31, 2015, for Chinese Application No. 201380000922.6, with an English translation.

* cited by examiner

METHOD AND DEVICE FOR PREDICTING STATE-OF-HEALTH OF BATTERY, AND BATTERY MANAGEMENT SYSTEM USING SAME

TECHNICAL FIELD

This application claims the benefit of Korean Patent Application No. 10-2012-0010661, filed on Feb. 2, 2012, which is hereby incorporated by reference in its entirety into this application.

The present invention relates to a battery management system, and more particularly, to a method and a device for predicting a state-of-health of a battery.

BACKGROUND ART

As portable electric products such as a notebook, a video camera, a mobile phone, and the like, have been actively used, the importance of a rechargeable battery mainly used as a driving power supply therefor is being increased. In recent years, due to the increased focus on environmental problems, a research for a hybrid vehicle and an electric vehicle is being conducted actively. Since a hybrid vehicle or an electric vehicle drives vehicles by using charging and discharging energy of a battery, the hybrid or electric vehicle may have more excellent fuel efficiency and reduce pollutants, as compared with a vehicle using only an engine, and therefore has received a positive consumer response. Subsequently, an interest and a research for a battery, which is a core part of the hybrid vehicle or the electric vehicle, has been intensively increased.

In addition, the importance for a technology of a battery management system for more efficiently using and managing a battery has increased. In particular, the battery management system needs to accurately predict a state-of-health (SOH) of a battery so as to appropriately control a use strategy of a charging or discharging output and a state of charging (SOC) of the battery.

Therefore, in order to increase prediction accuracy of the SOH of a battery to reduce an estimated error, there is a need to obtain an average value closest to an actual SOH except for values that are predicted higher or lower than the actual SOH.

DISCLOSURE

Technical Problem

The present invention is to provide a method and an apparatus for predicting a state-of-health (SOH) of a battery for obtaining a more accurate SOH prediction value other than a maximum value and a minimum value using values obtained by predicting the SOH of a battery, and a battery management system using same.

Technical Solution

An exemplary embodiment of the present invention provides a device for predicting a state-of-health of a battery, including: an SOH estimation unit that estimates state-of-health (SOH) estimation values for predicting an aged degree of the battery; a data storage unit that stores the SOH estimation values to create a history table; and a processing unit that extracts candidate values from the history table to determine a targeted SOH of the battery.

The candidate values may be values other than a maximum value and a minimum value of the history table.

The targeted SOH of the battery may be an average of the candidate values.

The history table may be configured by aligning the SOH estimation values in an ascending order or a descending order.

The data storage unit may use an electrically erasable and programmable ROM (EEPROM).

Another exemplary embodiment of the present invention provides a method for predicting a state-of-health of a battery, including: estimating state-of-health (SOH) estimation values for predicting an aged degree of the battery for each time; aligning the plurality of estimated values to create a history table; extracting candidate values from the history table; and determining a targeted SOH of the battery based on the candidate values.

The candidate values may be values other than a maximum value and a minimum value of the history table. The targeted SOH of the battery may be an average of the candidate values.

The history table may be configured by aligning the SOH estimation values in an ascending order or a descending order.

The history table may use an electrically erasable and programmable ROM (EEPROM).

The method for predicting a state-of-health of a battery may further include: outputting the targeted SOH of the battery to a user.

Yet another exemplary embodiment of the present invention provides a battery management system for predicting a state-of-health of a battery, including: a state-of-health (SOH) estimation unit that estimates the SOH estimation values; a data storage unit that stores the SOH estimation values to create a history table; and a processing unit that extracts candidate values from the history table to determine a targeted SOH of the battery.

The candidate values may be values other than a maximum value and a minimum value of the history table. The targeted SOH of the battery may be an average of the candidate values. The history table may be configured by aligning the SOH estimation values in an ascending order or a descending order.

Advantageous Effects

As set forth above, it is possible to minimize the predicted error of the SOH of the battery to obtain the more accurately predict values of the SOH of the battery.

BEST MODE

Hereinafter, exemplary embodiments of the present invention will be described in detail with reference to the accompanying drawings so that those skilled in the art may easily work the present invention. Further, the present invention is not limited to the embodiment described below but may be applied in various forms within a technical scope of the present invention.

Components described in the present specification may include components other than components to be described below as needed and the detailed description of contents that are not directly connected with the present invention or overlapping contents will be omitted. Further, an arrangement of each component described in the present specification can be adjusted as needed and one component may be included in another component and one component may be subdivided into at least two components.

Hereinafter, an electric vehicle described to be below means a vehicle that includes one or more electric motors as a driving force. Energy used to drive an electric car includes electrical sources such as a rechargeable battery and/or a fuel cell. An electric vehicle may be a hybrid electric vehicle that uses a combustion engine as another power source.

Figure 1:
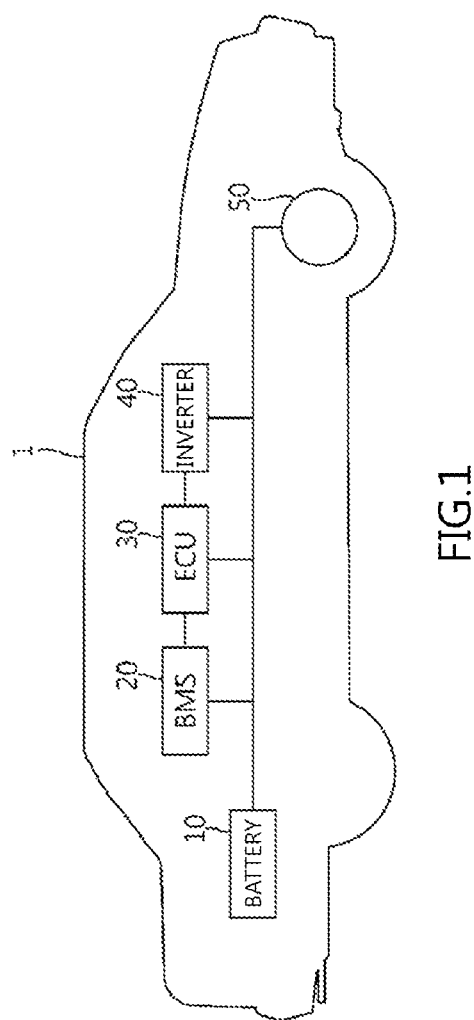
FIG. 1 is a block diagram schematically illustrating an electric vehicle using a method for predicting a state-of-health (SOH) of a battery according to an exemplary embodiment of the present invention.

FIG. 1 is a block diagram schematically illustrating an electric car using a method for predicting a state-of-health (SOH) of a battery according to an exemplary embodiment of the present invention.

Referring to FIG. 1, an electric vehicle 1 may include a battery 10, a battery management system (BMS) 20, an electronic control unit (ECU) 30, an inverter 40, and a motor 50.

The battery 10 is an electric energy source that supplies a driving force to the motor 50 to drive the electric vehicle 1. The battery 100 may be charged or discharged by the inverter 40 in response to the driving of the motor 50 and/or the combustion engine (not illustrated).

Herein, a kind of the battery 10 is not particularly limited and may include, for example, a lithium ion battery, a lithium polymer battery, a nickel cadmium battery, a nickel hydrogen battery, a nickel zinc battery, and the like.

In addition, the battery 10 is configured of a battery pack in which a plurality of battery cells is connected in series and/or in parallel. In addition, the battery 10 may also be configured of at least one battery pack.

The BMS 20 estimates a state of the battery 10 and manages the battery 10 using the estimated state information. For example, state information of the battery 10, such as a state of charging (SOC), a state-of-health (SOH), a maximum input/output power tolerable amount, output voltage, and the like, of the battery 10, is estimated and managed. In addition, the charging and discharging of the battery 10 is controlled using the state information.

In addition, the BMS 20 according to the present invention includes a device (200 of FIG. 2) for predicting a state-of-health (hereinafter, referred to as SOH) of a battery to be described below.

The ECU 30 is an electronic control device that controls the state of the electric vehicle 1. For example, torque information is determined and an output of the motor 50 is controlled to meet the torque information, based on information, such as an accelerator, a brake, a speed, and the like.

In addition, the ECU 30 transmits a control signal to the inverter 40, so that the battery 10 may be charged or discharged base on the state information such as SOC, SOH, and the like of the battery 10 transmitted by the BMS 20.

The inverter 40 charges or discharges the battery 10 based on the control signal of the ECU 30.

The motor 50 drives the electric vehicle 1 based on the control information (for example, torque information) that is transmitted from the ECU 30 using electric energy of the batter 10.

As described above, the electric vehicle 1 is driven using the electric energy of the battery 10, and therefore it is important to predict the state of the battery 10.

Hereinafter, a device and a method for predicting a state-of-health of a battery capable of estimating the state-of-health of a battery and reducing errors of the estimated value will be described with reference to FIGS. 2 and 3.

Figure 2:
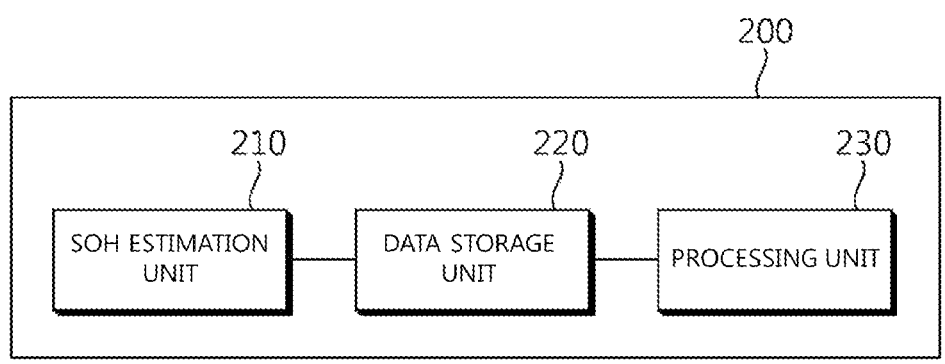
FIG. 2 is a block diagram illustrating a device for predicting the SOH of the battery according to the exemplary embodiment of the present invention.

FIG. 2 is a block diagram illustrating a device for predicting the SOH of the battery according to the exemplary embodiment of the present invention.

Referring to FIG. 2, a device 200 for predicting a state-of-health of a battery may include an SOH estimation unit 210, a data storage unit 220, and a processing unit 230.

The SOH estimation unit 210 estimates SOH estimation values for predicting an aged degree of a battery.

Herein, the SOH estimation of the battery may be performed in various methods. For example, the SOH may be estimated based on the internal resistance and temperature of the battery. That is, the capacity of the battery is measured for each internal resistance and temperature of the battery based on the charging and discharging experiment. Next, the measured capacity is relatively digitized based on the initial capacity of the battery to obtain a lookup table for SOH mapping. In addition, the SOH of the battery may be estimated by measuring the internal resistance and temperature of the battery under the actual use environment of the battery and mapping the SOH corresponding to the internal resistance and temperature in the lookup table. In addition, various SOH estimation algorithms may also be used.

The data storage unit 220 receives and stores the SOH estimated value from the SOH estimation unit 210 and creates a history table based on the stored SOH estimation values.

In more detail, the data storage unit 220 receives the SOH estimated by the SOH estimation unit 210. In this case, the SOH estimation unit 210 may estimate the SOH periodically or by a request signal and transmits the SOH estimation values to the data storage unit 220.

The data storage unit 220 aligns the received SOH estimation values to create the history table. For example, a space, that is, the history table is created to store twenty SOH estimation values. In this case, twenty SOH estimation values may be aligned and stored by an ascending or descending order, and the like.

Herein, the data storage unit 220 may use memories, such as an electrically erasable and programmable ROM (EEPROM), a flash memory, and the like.

The processing unit 230 estimates candidate values from the history table created by the data storage unit 220 to determine the targeted SOH of the battery.

In more detail, the processing unit 230 extracts the candidate values from the SOH estimation values stored in the history table. Herein, the candidate values are values for determining a targeted SOH and include values other than at least a maximum value and a minimum value among the values stored in the history table. For example, the SOH estimation values other than the values that are stored in upper and lower portions among the SOH estimation values stored in the history table may be selected as the candidate values.

Next, the processing unit 230 calculates an average of the SOH estimation values selected as the candidate values and determines the average value as the targeted SOH. In this case, the targeted SOH may be used as parameter values to allow the BMS (20 of FIG. 1) to estimate and manage the state of the battery. In addition, the targeted SOH may also be provided to the user as the information of the battery.

Figure 3:
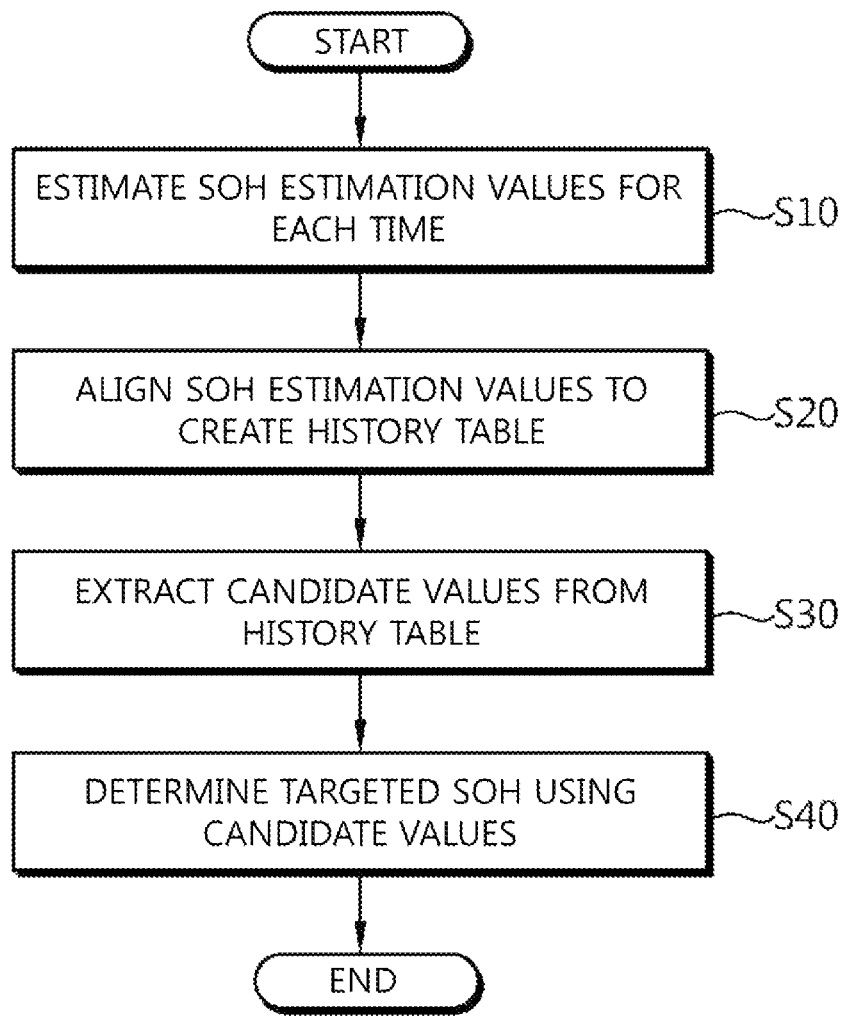
FIG. 3 is a flow chart illustrating a method for predicting the SOH of the battery according to the exemplary embodiment of the present invention.

FIG. 3 is a flow chart illustrating a method for predicting the SOH of the battery according to the exemplary embodiment of the present invention. The method may be performed by the device 200 for predicting a state-of-health of a battery of FIG. 2.

Referring to FIG. 3, the SOH estimation values for predicting the aged degree of the battery for each time are estimated (S10). Herein, the SOH estimation of the battery may be estimated using the internal resistance and temperature of the battery as described above and may be performed by various methods for estimating SOH. The SOH estimation may be performed periodically and may be performed by a request signal.

The following Table 1 shows an example of the SOH estimation values estimated for each time.

TABLE 1

| SOH Estimation Value for Each Time |
| --- |
| 99 |
| 93 |
| 91 |
| 79 |
| 84 |
| 95 |
| 96 |
| 80 |
| 84 |
| 94 |
| 95 |
| 80 |
| 84 |
| 94 |
| 95 |
| 80 |
| 84 |
| 91 |
| 89 |
| 95 |

Next, the history table is created by aligning the estimated SOH estimation values (S20). For example, the SOH estimation values estimated for each time may be aligned and stored in the history table in an ascending order or a descending order. In this case, the history table may use memories, such as an electrically erasable and programmable ROM (EEPROM), a flash memory, and the like.

The following Table 2 shows an example of the history table in which the SOH estimation values for each time of Table 1 are aligned in a descending order.

TABLE 2

| SOH Estimation Value Stored in History Table |
| --- |
| 99 |
| 96 |
| 95 |
| 95 |
| 95 |
| 95 |
| 94 |
| 94 |
| 93 |
| 91 |
| 91 |
| 89 |
| 84 |
| 84 |
| 84 |
| 84 |
| 80 |
| 80 |
| 80 |
| 79 |

Next, the candidate values are extracted from the history table (S30). In this case, the candidate values are configured as values other than at least a maximum value and a minimum value among the SOH estimation values stored in the history table.

For example, the values other than the values stored in the upper and lower portions among the SOH estimation values of the history table of Table 2 may be extracted as the candidate values. The values other than the upper five SOH estimation values and the lower five SOH estimation values of the history table of Table 2 may be extracted as the candidate values. The following Table 3 shows an example of the candidate values other than the upper and lower values.

TABLE 3

| Candidate Value |
| --- |
| 95 |
| 94 |
| 94 |
| 93 |
| 91 |
| 91 |
| 89 |
| 84 |
| 84 |
| 84 |

Next, the targeted SOH of the battery is determined based on the candidate values (S40). That is, the average of the SOH estimation values estimated as the candidate values is calculated and the average value is determined as the targeted SOH. For example, when the candidate values are selected as shown in Table 3, the average of the candidate values is calculated as $(95+94+94+93+91+91+89+84+84+84)/10=89.1$, which is determined as the targeted SOH.

In this case, the targeted SOH is output to a display screen, and the like, and may provide the state-of-health information on the battery to the user.

The method and device for predicting a state-of-health of a battery according to the present invention described above use the history table to determine the SOH other than the values predicted higher than predicted and the values predicted lower than predicted. Therefore, the SOH estimation error may be minimized by taking the most averaged value.

Further, the exemplary embodiment of the present invention describes the device and method for predicting a SOH of a battery, but may be applied to a system in which a measured value is not suddenly changed but slowly changed, like the SOH.

The steps of the flow chart according to the present invention as described above may be generated in steps and an order different from the foregoing description or simultaneously. Further, it may be appreciated by those skilled in the art that steps shown in a flow chart are non-exclusive and include other steps or one or more steps in a flow chart may be deleted without having an effect on the scope of the present invention.

The above description is only illustrative for the technical spirit of the present invention, and it will be appreciated by those skilled in the art that various modifications and alterations can be made without departing from the essential characteristics of the present invention. Accordingly, the embodiments disclosed in the present invention are used not to limit but to describe the technical spirit of the present invention, and the scope of the present invention is not limited only to the embodiments. The protection scope of the present invention should be construed by the appended claims and it should be construed that the technical spirit within a scope equivalent thereto is included in the scope of right of the present invention.

The invention claimed is:

1. A system comprising:
a battery management system (BMS) to control a battery; and
a device for predicting a state-of-health of the battery, the device comprising:
an SOH estimation unit that estimates state-of-health (SOH) estimation values for predicting an aged degree of the battery periodically or in response to a request signal;
a data storage unit that aligns the SOH estimation values in an ascending order or a descending order and stores the SOH estimation values to create a history table; and
a processing unit that extracts candidate values from the SOH estimation values aligned in the history table other than the values that are stored in the upper and lower portions among the SOH estimation values stored in the history table to determine a targeted SOH of the battery based on the candidate values and transmits the targeted SOH to the BMS,
wherein the BMS controls the discharging and charging of the battery based on the targeted SOH.

2. The system of claim 1, wherein the candidate values are values other than a maximum value and a minimum value of the history table.

3. The system of claim 2, wherein the targeted SOH of the battery is an average of the candidate values.

4. The system of claim 1, wherein the data storage unit uses an electrically erasable and programmable ROM (EEPROM).

5. The system of claim 1, wherein the processing unit extracts candidate values from the SOH estimation values aligned in the history table other than five upper most values and five lower most values among the SOH estimation values stored in the history table to determine the targeted SOH of the battery based on the candidate values and transmits the targeted SOH to the BMS.

6. A method for controlling a battery, comprising:
estimating state-of-health (SOH) estimation values for predicting an aged degree of the battery periodically or by a signal request for each time;
aligning the plurality of estimated values estimated periodically or in response to a request signal in an ascending order or a descending order to create a history table by a processing unit;
extracting candidate values from the plurality of estimated values aligned in the history table;
determining a targeted SOH of the battery based on the candidate values other than the values that are stored in the upper and lower portions among the SOH estimation values stored in the history table;
transmitting the targeted SOH of the battery to a battery management system (BMS); and
controlling the discharging and charging of the battery by the BMS based on the targeted SOH.

7. The method of claim 6, wherein the candidate values are values other than a maximum value and a minimum value of the history table.

8. The method of claim 7, wherein the targeted SOH of the battery is an average of the candidate values.

9. The method of claim 6, wherein the history table uses an electrically erasable and programmable ROM (EEPROM).

10. The method of claim 6, further comprising:
outputting the targeted SOH of the battery to a user.

11. The method of claim 6, wherein determining the targeted SOH of the battery is based on the candidate values other than the other than five upper most values and five lower most values among the SOH estimation values stored in the history table to determine the targeted SOH of the battery based on the candidate values.

* * * * *